United States Patent
Miyahara et al.

(10) Patent No.: US 11,244,785 B2
(45) Date of Patent: Feb. 8, 2022

(54) ELECTRONIC COMPONENT INCLUDING SHIELD ELECTRODES

(71) Applicant: Murata Manufacturing Co., Ltd., Nagaokakyo (JP)

(72) Inventors: Kunihiro Miyahara, Nagaokakyo (JP); Noboru Shiokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 192 days.

(21) Appl. No.: 16/373,720

(22) Filed: Apr. 3, 2019

(65) Prior Publication Data

US 2019/0228906 A1 Jul. 25, 2019

Related U.S. Application Data

(63) Continuation of application No. PCT/JP2017/032184, filed on Sep. 7, 2017.

(30) Foreign Application Priority Data

Oct. 11, 2016 (JP) .............................. JP2016-199772

(51) Int. Cl.
  *H01F 27/36* (2006.01)
  *H01F 27/28* (2006.01)
  (Continued)

(52) U.S. Cl.
  CPC ......... *H01F 27/36* (2013.01); *H01F 17/0013* (2013.01); *H01F 27/2804* (2013.01);
  (Continued)

(58) Field of Classification Search
  CPC .. H01F 27/28; H01F 27/2804; H01F 27/2809; H01F 27/2814; H01F 27/2819;
  (Continued)

(56) References Cited

U.S. PATENT DOCUMENTS 5,374,909 A * 12/1994 Hirai ................... H01P 1/20345
  333/204
5,523,729 A * 6/1996 Nakai ................. H01P 1/20345
  333/177
(Continued)

FOREIGN PATENT DOCUMENTS

JP    07-58508 A    3/1995
JP    09-121093 A   5/1997
(Continued)

OTHER PUBLICATIONS

Official Communication issued in Japanese Patent Application No. 2018-544703, dated Mar. 10, 2020.
(Continued)

*Primary Examiner* — Thienvu V Tran
*Assistant Examiner* — Carlos O Rivera-Perez
(74) *Attorney, Agent, or Firm* — Keating & Bennett, LLP

(57) ABSTRACT

An electronic component includes an upper surface, a lower surface, a side surface, a circuit pattern, and an upper surface shield electrode. The circuit pattern is provided inside the electronic component. The upper surface shield electrode is disposed on the upper surface. In a plan view from a normal direction of the upper surface, a center of gravity of the upper surface shield electrode is spaced from a center of gravity of the upper surface.

19 Claims, 12 Drawing Sheets

(51) Int. Cl.
  *H01F 27/40* (2006.01)
  *H01G 4/40* (2006.01)
  *H03H 1/00* (2006.01)
  *H01G 4/005* (2006.01)
  *H03H 7/01* (2006.01)
  *H01F 17/00* (2006.01)

(52) U.S. Cl.
  CPC ......... *H01F 27/2885* (2013.01); *H01F 27/40* (2013.01); *H01G 4/005* (2013.01); *H01G 4/40* (2013.01); *H03H 1/00* (2013.01); *H03H 7/01* (2013.01); *H01F 2017/008* (2013.01); *H01F 2017/0026* (2013.01); *H01F 2027/2809* (2013.01); *H03H 2001/0085* (2013.01)

(58) Field of Classification Search
  CPC ............. H01F 27/2847; H01F 27/2866; H01F 27/288; H01F 27/2885; H01F 27/34; H01F 27/36; H01F 27/361; H01F 27/363; H01F 27/366; H01F 27/40; H01F 17/00; H01F 17/0006; H01F 17/0013; H01F 2017/002; H01F 2017/0026; H01F 2017/008; H01F 2027/28; H01F 2027/2804; H01F 2027/2809; H01G 4/00; H01G 4/002; H01G 4/005; H01G 4/30; H01G 4/304; H01G 4/32; H01G 4/33; H01G 4/40; H01G 4/012; H03H 2001/0014; H03H 2001/0021; H03H 2001/0092; H03H 1/00; H03H 1/0007; H03H 1/02; H03H 7/00; H03H 7/01; H03H 7/0115; H03H 7/0138; H03H 7/0153; H03H 7/0161; H03H 7/17; H03H 7/1725; H03H 7/1741–1791; H03H 2001/0085

USPC .. 361/142, 268–270, 679.01, 748, 752, 753, 361/760, 761, 763, 764, 777, 782, 790, 361/799; 333/167, 172, 175, 176, 185, 333/204
  See application file for complete search history.

(56) References Cited

U.S. PATENT DOCUMENTS

| | | | |
|---|---|---|---|
| 7,369,018 | B2 * | 5/2008 | Shinabe .............. H01P 1/20345 333/204 |
| 2002/0057139 | A1 | 5/2002 | Matsumura et al. |
| 2006/0192637 | A1 | 8/2006 | Urano et al. |
| 2013/0301227 | A1 | 11/2013 | Kawano |

FOREIGN PATENT DOCUMENTS

| | | |
|---|---|---|
| JP | 09-205018 A | 8/1997 |
| JP | 2002-057543 A | 2/2002 |
| JP | 2003-188039 A | 7/2003 |
| JP | 2004-312065 A | 11/2004 |
| JP | 2005-251827 A | 9/2005 |
| JP | 2010-057117 A | 3/2010 |
| JP | 2010-073961 A | 4/2010 |
| WO | 2012/101920 A1 | 8/2012 |

OTHER PUBLICATIONS

Official Communication issued in International Patent Application No. PCT/JP2017/032184, dated Dec. 12, 2017.
Official Communication issued in corresponding Japanese Patent Application No. 2018-544703, dated Nov. 4, 2020.

* cited by examiner

ELECTRONIC COMPONENT INCLUDING SHIELD ELECTRODES

CROSS REFERENCE TO RELATED APPLICATIONS

This application claims the benefit of priority to Japanese Patent Application No. 2016-199772 filed on Oct. 11, 2016 and is a Continuation Application of PCT Application No. PCT/JP2017/032184 filed on Sep. 7, 2017. The entire contents of each of these applications are hereby incorporated herein by reference.

BACKGROUND OF THE INVENTION

1. Field of the Invention

The present invention relates to electronic components each provided with shield electrodes.

2. Description of the Related Art

Electronic components defining an integrated circuit are disposed close to each other on a circuit board in many cases. Accordingly, in a case in which noise generated inside the electronic component leaks to the outside, the noise may have an unfavorable influence on other electronic components near the noise-source electronic component.

In order to prevent such a situation, a shield electrode is disposed on a surface of an electronic component in some case, as in the case of a shield-type lamination electronic component that is disclosed in Japanese Unexamined Patent Application Publication No. 9-121093.

Noise from the inside or outside of an electronic component is guided to a ground electrode through a shield electrode. In an electronic component provided with a shield electrode, it is possible to suppress a situation in which noise enters from the outside, and to suppress the leakage of magnetic flux to the outside of the electronic component. This type of effect produced by the shield electrode is also referred to as a "shielding effect" hereinafter.

It is required, in some electronic components, to identify the arrangement orientation (mounting direction) thereof on a circuit board. Since various types of electronic components are disposed close to each other on a circuit board, it is necessary to be able to confirm the mounting direction at an upper surface of each electronic component in a plan view of the circuit board from a normal direction thereof.

A shield electrode is disposed on an upper surface of the electronic component disclosed in Japanese Unexamined Patent Application Publication No. 9-121093, and the shield electrode is able to be confirmed in a plan view of the circuit board from a normal direction thereof. However, even when the electronic component is rotated 180 degrees in a plan view from the normal direction of the circuit board and is disposed on the circuit board, almost no change in appearance is able to be recognized in the plan view from the normal direction of the circuit board. As such, it is difficult to identify the mounting direction of the electronic component by the shield electrode.

A direction identification mark is disposed on an upper surface of an electronic component in some case in order to identify the mounting direction thereof. In a case in which a direction identification mark is to be disposed on the electronic component disclosed in Japanese Unexamined Patent Application Publication No. 9-121093, a process of disposing the direction identification mark on the upper surface of the electronic component is additionally required. This increases the manufacturing cost of the electronic component.

SUMMARY OF THE INVENTION

Preferred embodiments of the present invention reduce the manufacturing cost of electronic components which are each provided with a shield electrode and the mounting directions of which are able to be identified.

An electronic component according to a preferred embodiment of the present invention includes an upper surface, a lower surface, and a side surface. The electronic component includes a circuit pattern and an upper surface shield electrode. The circuit pattern is provided inside the electronic component. The upper surface shield electrode is disposed on the upper surface. In a plan view from a normal direction of the upper surface, the center of gravity of the upper surface shield electrode is shifted from the center of gravity of the upper surface.

In an electronic component according to a preferred embodiment of the present invention, the center of gravity of the upper surface shield electrode is shifted from the center of gravity of the upper surface. When the electronic component is rotated about 180 degrees in a plan view from the normal direction of a circuit board and is disposed on the circuit board, since the appearance of the electronic component in the plan view from the normal direction of the circuit board changes, the mounting direction of the electronic component is able to be identified. Since the upper surface shield electrode also defines and functions as a direction identification mark, a process of separately providing a direction identification mark on the upper surface of the electronic component is unnecessary. As a result, it is possible to reduce the manufacturing cost of the electronic components, which are each provided with the shield electrode, and the mounting directions of which are able to be identified.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
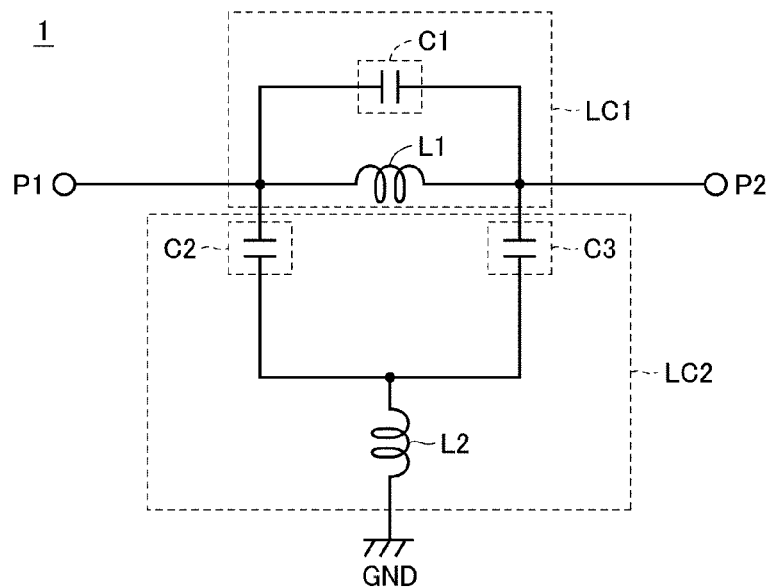
FIG. 1 is a circuit diagram of a low pass filter as an example of an electronic component according to a first preferred embodiment of the present invention.

Hereinafter, preferred embodiments of the present invention will be described in detail with reference to the accompanying drawings. Note that the same or corresponding elements are assigned the same reference signs in the drawings, and description thereof will not be repeated or will be simplified.

First Preferred Embodiment

FIG. 1 is a circuit diagram of a low pass filter 1 as an example of an electronic component according to a first preferred embodiment of the present invention. The low pass filter 1 is mounted on a circuit board, and a circuit pattern corresponding to the circuit illustrated in FIG. 1 is provided inside the low pass filter 1. As illustrated in FIG. 1, the low pass filter 1 includes an input-output terminal P1, an input-output terminal P2, an LC parallel resonator LC1, and an LC series resonator LC2.

The LC parallel resonator LC1 includes an inductor L1 and a capacitor C1. The inductor L1 is connected between the input-output terminal P1 and the input-output terminal P2. The capacitor C1 is connected in parallel to the inductor L1, between the input-output terminal P1 and the input-output terminal P2.

The LC series resonator LC2 includes an inductor L2, a capacitor C2 and a capacitor C3. One end of the inductor L2 is connected to a ground point GND. The capacitor C2 is connected between the input-output terminal P1 and the other end of the inductor L2. The capacitor C3 is connected between the input-output terminal P2 and the other end of the inductor L2.

Figure 2:
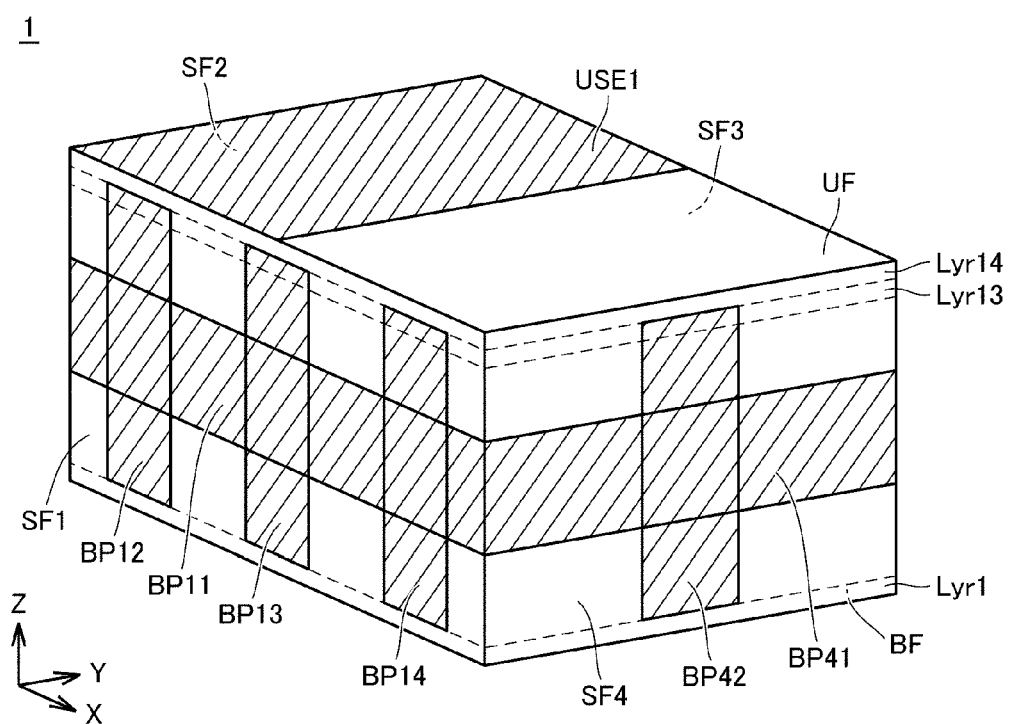
FIG. 2 is an external appearance perspective view of the low pass filter in FIG. 1.
Figure 3:
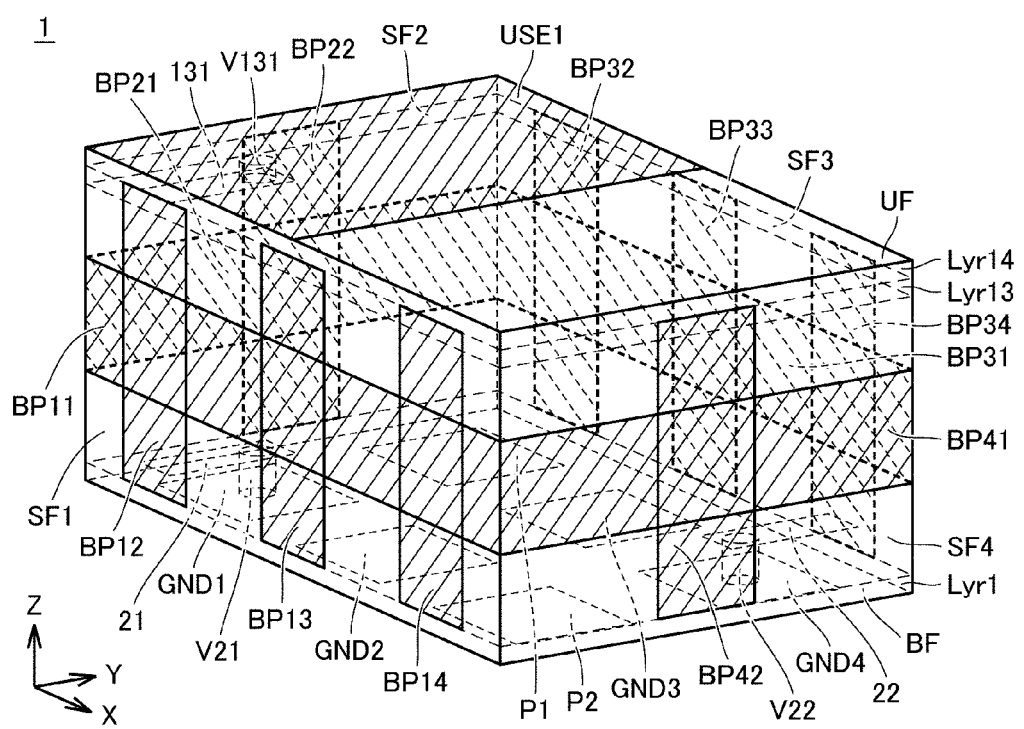
FIG. 3 is an external appearance see-through view of the low pass filter in FIG. 1.

FIG. 2 is an external appearance perspective view of the low pass filter 1 in FIG. 1. FIG. 3 is an external appearance see-through view of the low pass filter 1 in FIG. 1. In FIG. 3, a circuit pattern provided inside the low pass filter 1 is not illustrated in order to simplify the description. As will be explained later with reference to FIG. 4, the low pass filter 1 is a multilayer body in which a plurality of dielectric layers Lyr1 to Lyr14 are laminated in a Z-axis direction (lamination direction).

As illustrated in FIG. 2 and FIG. 3, the low pass filter preferably has, for example, a rectangular or substantially rectangular parallelepiped shape. Surfaces of the outermost layers perpendicular or substantially perpendicular to the lamination direction of the low pass filter 1 are respectively referred to as a bottom surface BF and an upper surface UF. Of the surfaces parallel or substantially parallel to the lamination direction, surfaces parallel or substantially parallel to a Z-X plane are defined as side surfaces SF1 and SF3. Of the surfaces parallel or substantially parallel to the lamination direction, surfaces parallel to a Y-Z plane are defined as side surfaces SF2 and SF4.

On the bottom surface BF, the input-output terminals P1 and P2, and ground electrodes GND1 to GND4 are provided. The input-output terminals P1 and P2, and the ground electrodes GND1 to GND4 are preferably, for example, land grid array (LGA) terminals defined by planar electrodes that are regularly arranged on the bottom surface BF. The bottom surface BF is connected to a circuit board (not illustrated).

On the upper surface UF, an upper surface shield electrode USE1 is provided and defines and functions as a shield electrode. On the side surfaces SF1 to SF4, a plurality of band-shaped conductor patterns BP11 to BP14, BP21, BP22, BP31 to BP34, BP41, and BP42 are disposed in lattice configuration and define and function as shield electrodes. The shield electrodes disposed on the side surfaces SF1 to SF4 are not provided on the side surfaces of the dielectric layer Lyr1 (lowermost layer) including the bottom surface BF and the side surfaces of the dielectric layer Lyr14 (uppermost layer) including the upper surface UF.

The band-shaped conductor patterns BP11 to BP14 are disposed on the side surface SF1. The band-shaped conductor pattern BP11 extends in an X-axis direction. The band-shaped conductor patterns BP12 to BP14 are spaced apart from each other in the X-axis direction. Each of the band-shaped conductor patterns BP12 to BP14 extends in the Z-axis direction and is orthogonal or substantially orthogonal to the band-shaped conductor pattern BP11. The band-shaped conductor pattern BP12 is connected to the ground electrode GND1 via a line conductor pattern 21 and a via conductor pattern V21.

On the side surface SF2, the band-shaped conductor patterns BP21 and BP22 are disposed. The band-shaped conductor pattern BP21 extends in a Y-axis direction and is connected to the band-shaped conductor pattern BP11. The band-shaped conductor pattern BP22 extends in the Z-axis direction and is orthogonal or substantially orthogonal to the band-shaped conductor pattern BP21.

The band-shaped conductor patterns BP31 to BP34 are disposed on the side surface SF3. The band-shaped conductor pattern BP31 extends in the X-axis direction and is connected to the band-shaped conductor pattern BP21. The band-shaped conductor patterns BP32 to BP34 are spaced apart from each other in the X-axis direction. Each of the band-shaped conductor patterns BP32 to BP34 extends in the Z-axis direction and is orthogonal or substantially orthogonal to the band-shaped conductor pattern BP31. The band-shaped conductor pattern BP34 is connected to the ground electrode GND4 via a line conductor pattern 22 and a via conductor pattern V22.

On the side surface SF4, the band-shaped conductor patterns BP41 and BP42 are disposed. The band-shaped conductor pattern BP41 extends in the Y-axis direction and is connected to the band-shaped conductor patterns BP11 and BP31. The band-shaped conductor pattern BP42 extends in the Z-axis direction and is orthogonal or substantially orthogonal to the band-shaped conductor pattern BP41.

On the upper surface UF, the upper surface shield electrode USE1 preferably having a planar shape, for example, is disposed. The upper surface shield electrode USE1 is connected to the band-shaped conductor pattern BP12 via a via conductor pattern V131 and a line conductor pattern 131.

Figure 4:
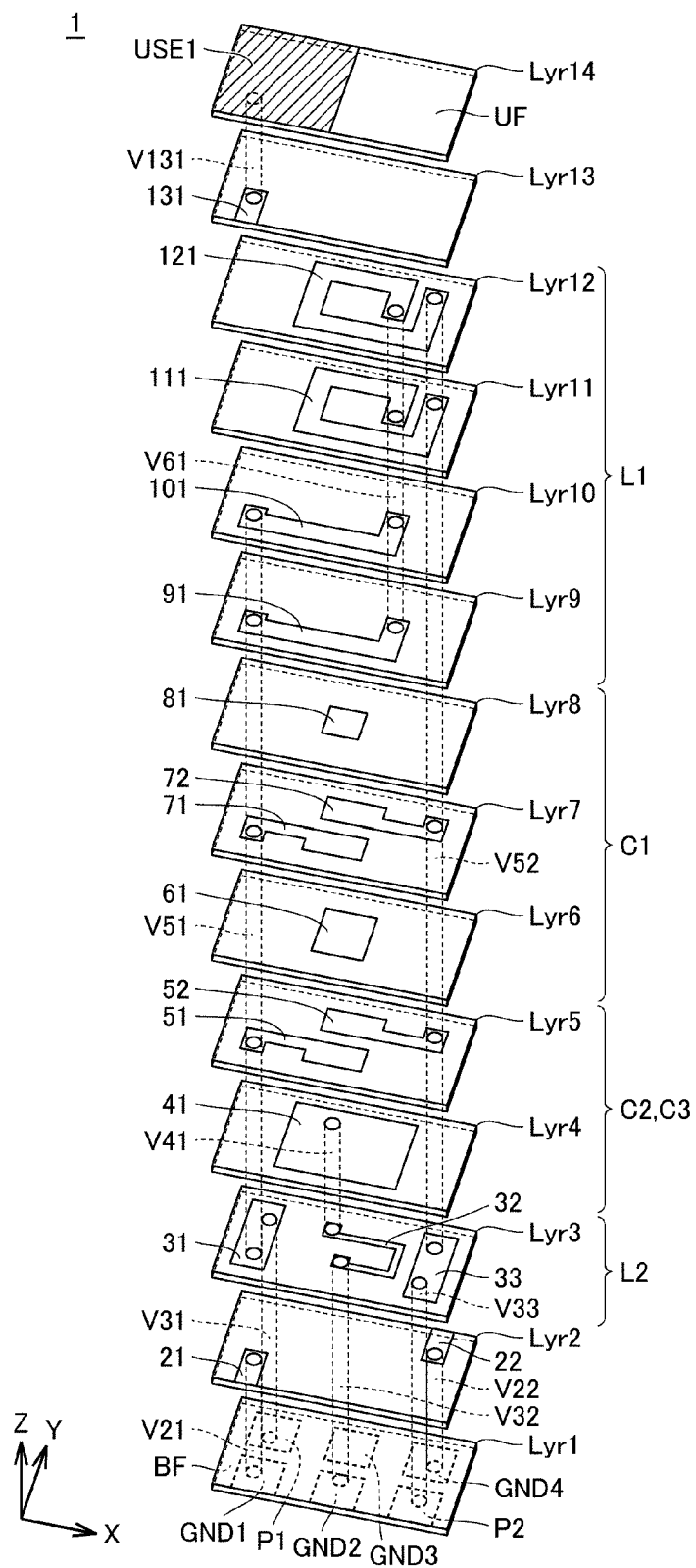
FIG. 4 is an exploded perspective view illustrating a lamination structure of the low pass filter in FIG. 1.

FIG. 4 is an exploded perspective view illustrating a lamination structure of the low pass filter 1 in FIG. 1. The low pass filter 1 is a multilayer body including a plurality of dielectric layers. The low pass filter 1 includes a plurality of dielectric layers Lyr1 to Lyr14. The dielectric layers are laminated in such order in the Z-axis direction that the dielectric layer Lyr1 is disposed on the bottom surface BF side and the dielectric layer Lyr14 is disposed on the upper surface UF side.

As described above, the input-output terminals P1 and P2, and the ground electrodes GND1 to GND4 are provided on the bottom surface BF of the dielectric layer Lyr1.

On the dielectric layer Lyr2, the line conductor patterns 21 and 22 are provided. The line conductor pattern 21 is connected to the ground electrode GND1 by the via conductor pattern V21. The line conductor pattern 22 is connected to the ground electrode GND4 by the via conductor pattern V22.

On the dielectric layer Lyr3, line conductor patterns 31 to 33 are provided. The line conductor pattern 31 is connected to the input-output terminal P1 by a via conductor pattern V31. The line conductor pattern 32 is connected to the ground electrode GND2 by a via conductor pattern V32. The line conductor pattern 33 is connected to the input-output terminal P2 by a via conductor pattern V33. The line conductor pattern 32 forms the inductor L2. The inductor L2 is wound around a winding axis parallel or substantially parallel to the lamination direction.

A capacitor conductor pattern 41 is provided on the dielectric layer Lyr4. The capacitor conductor pattern 41 is connected to the line conductor pattern 32 by a via conductor pattern V41.

Capacitor conductor patterns 51 and 52 are provided on the dielectric layer Lyr5. The capacitor conductor pattern 51 is connected to the line conductor pattern 31 by a via conductor pattern V51. The capacitor conductor pattern 52 is connected to the line conductor pattern 33 by a via conductor pattern V52.

In a plan view from the lamination direction, each of the capacitor conductor patterns 51 and 52 overlaps with the capacitor conductor pattern 41. The capacitor conductor patterns 41 and 51 define the capacitor C2. The capacitor conductor patterns 41 and 52 define the capacitor C3.

A capacitor conductor pattern 61 is provided on the dielectric layer Lyr6. Capacitor conductor patterns 71 and 72 are provided on the dielectric layer Lyr7. The capacitor conductor pattern 71 is connected to the capacitor conductor pattern 51 by the via conductor pattern V51. The capacitor conductor pattern 72 is connected to the capacitor conductor pattern 52 by the via conductor pattern V52. A capacitor conductor pattern 81 is provided on the dielectric layer Lyr8.

In a plan view from the lamination direction, each of the capacitor conductor patterns 71 and 72 overlaps with the capacitor conductor pattern 61. In the plan view from the lamination direction, the capacitor conductor pattern 81 overlaps with the capacitor conductor patterns 71 and 72. The capacitor conductor patterns 61, 71, 72 and 81 define the capacitor C1.

A line conductor pattern 91 is provided on the dielectric layer Lyr9. The line conductor pattern 91 is connected to the capacitor conductor pattern 71 by the via conductor pattern V51. A line conductor pattern 101 is provided on the dielectric layer Lyr10. The line conductor pattern 101 is connected to the line conductor pattern 91 by the via conductor pattern V51 and a via conductor pattern V61.

A line conductor pattern 111 is provided on the dielectric layer Lyr11. The line conductor pattern 111 is connected to the line conductor pattern 101 by the via conductor pattern V61. The line conductor pattern 111 is connected to the capacitor conductor pattern 72 by the via conductor pattern V52.

A line conductor pattern 121 is provided on the dielectric layer Lyr12. The line conductor pattern 121 is connected to the line conductor pattern 111 by the via conductor pattern V52 and the via conductor pattern V61. The line conductor patterns 91, 101, 111 and 121 define the inductor L1. The inductor L1 is wound around a winding axis parallel or substantially parallel to the lamination direction.

The circuit patterns corresponding to the circuit illustrated in FIG. 1 are provided on the dielectric layers Lyr1 to Lyr12.

The line conductor pattern 131 is provided on the dielectric layer Lyr13. As described above, the upper surface shield electrode USE1 is provided on the upper surface UF of the dielectric layer Lyr14. The upper surface shield electrode USE1 is connected to the line conductor pattern 131 by the via conductor pattern V131.

The low pass filter 1 is an electronic component whose arrangement orientation (mounting direction) on the circuit board needs to be identified. Since various types of electronic components are disposed close to each other on the circuit board, it is necessary to be able to confirm the mounting direction at the upper surface UF of the low pass filter 1 in a plan view from the normal direction of the circuit board (from the normal direction of the upper surface UF).

By additionally providing a direction identification mark on the upper surface UF of the low pass filter 1, it is possible to identify the mounting direction. However, in order to provide the direction identification mark on the upper surface UF of the low pass filter 1, a process of providing the direction identification mark such that the mark does not overlap with the upper surface shield electrode USE1 or a process of additionally forming a dielectric layer on which the direction identification mark is to be disposed is required, for example. As a result, the manufacturing cost of the low pass filter 1 increases.

Accordingly, in the first preferred embodiment, in a plan view from the normal direction of the upper surface UF, the upper surface shield electrode USE1 is disposed on the upper surface UF such that the upper surface shield electrode USE1 is not line-symmetric with respect to a specific axis. When the low pass filter 1 is rotated by about 180 degrees in a plan view from the normal direction of the circuit board and is disposed on the circuit board, the appearance of the low pass filter 1 in the plan view from the normal direction of the circuit board is changed. Therefore, it is possible to identify the mounting direction of the low pass filter 1. Since the upper surface shield electrode USE1 also defines and functions as a direction identification mark, a process of disposing a direction identification mark on the upper surface UF of the low pass filter 1 is unnecessary. This makes it possible to reduce the manufacturing cost of the low pass filter 1.

Figure 5A:
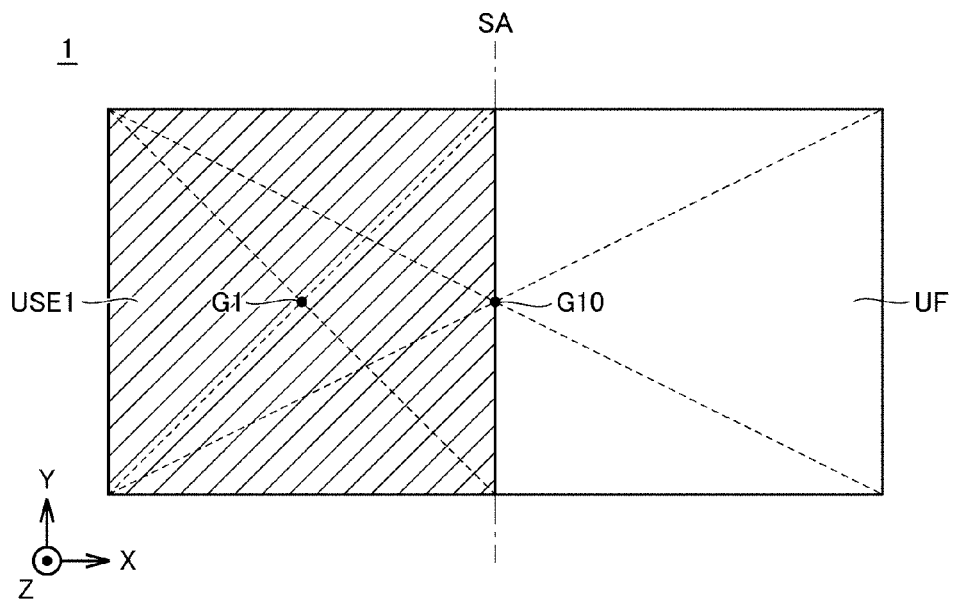
FIGS. 5A and 5B include drawings each illustrating a low pass filter in a plan view from a normal direction of an upper surface thereof.
Figure 5B:
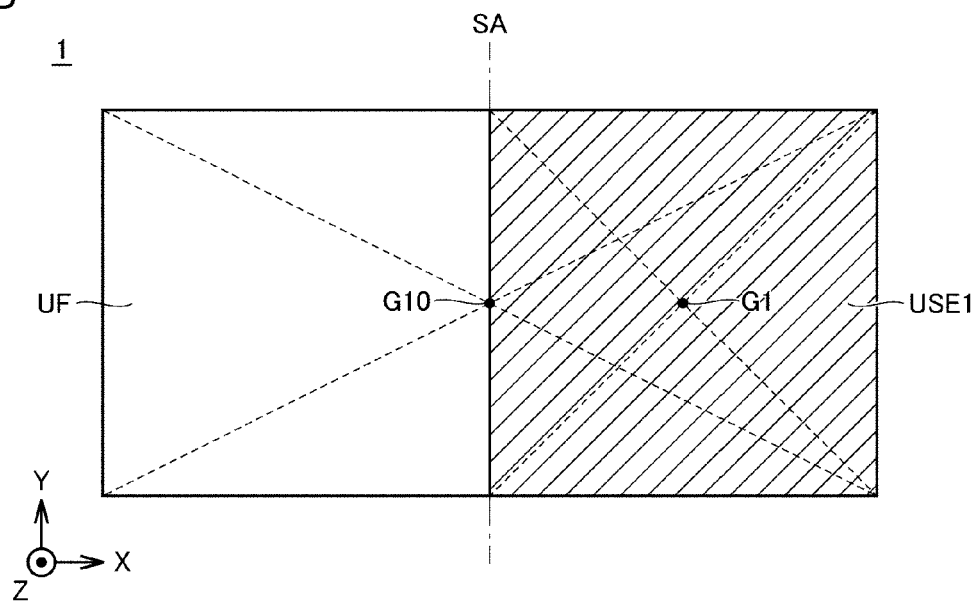

FIGS. 5A and 5B include drawings each illustrating the low pass filter 1 in a plan view from the normal direction of the upper surface UF. FIG. 5B is a drawing in which the low pass filter 1 illustrated in FIG. 5A is rotated by about 180 degrees. As illustrated in FIG. 5A, the upper surface UF is line-symmetric with respect to a specific axis SA. Because of this, it is difficult to identify the mounting direction corresponding to FIG. 5A and the mounting direction corresponding to FIG. 5B, by the shape of the upper surface UF in a plan view from the normal direction of the upper surface UF.

However, the upper surface shield electrode USE1 is not line-symmetric with respect to the specific axis SA. That is, a center of gravity G1 of the upper surface shield electrode USE1 is shifted from a center of gravity G10 of the upper surface UF. In the first preferred embodiment, in the plan view from the normal direction of the upper surface UF, the upper surface shield electrode USE1 covers one of two regions of the upper surface UF divided by the specific axis SA. The region covered by the upper surface shield electrode USE1 in FIG. 5A is located on the opposite side to that in FIG. 5B. Therefore, the appearances of the low pass filter 1 illustrated in FIGS. 5A and 5B differ from each other. As a result, in the low pass filter 1, it is possible to identify the mounting direction corresponding to FIG. 5A and the mounting direction corresponding to FIG. 5B.

As described above, according to the electronic component according to the first preferred embodiment, the center of gravity of the upper surface shield electrode disposed on the upper surface of the electronic component is shifted from the center of gravity of the upper surface of the electronic component in a plan view from the normal direction of the upper surface. When the electronic component is rotated about 180 degrees in a plan view from the normal direction of the circuit board and is disposed on the circuit board, since the appearance of the electronic component in the plan view from the normal direction of the circuit board changes, the mounting direction of the electronic component is able to be identified. Since the upper surface shield electrode also defines and functions as a direction identification mark, a process of additionally providing a direction identification mark on the upper surface of the electronic component is unnecessary. As a result, it is possible to reduce the manufacturing cost of the electronic component, which is provided with the shield electrode and the mounting direction of which is able to be identified.

Modification 1 of First Preferred Embodiment

In the first preferred embodiment, the shield electrodes disposed on the side surfaces are not provided on the side surfaces of the lowermost layer and the side surfaces of the uppermost layer. The shield electrodes disposed on the side surfaces may extend from the side surfaces of the lowermost layer to the side surfaces of the uppermost layer if it is possible to do so in the manufacturing process.

Figure 6:
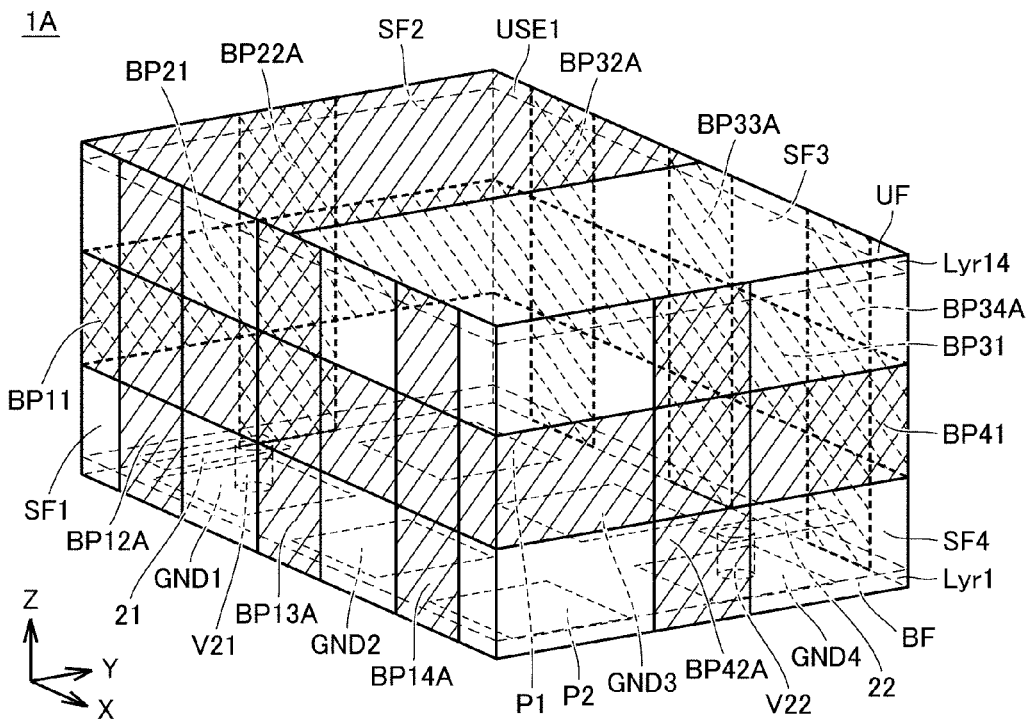
FIG. 6 is an external appearance perspective view of a low pass filter as an example of an electronic component according to a Modification 1 of the first preferred embodiment of the present invention.

FIG. 6 is an external appearance perspective view of a low pass filter 1A as an example of an electronic component according to a Modification 1 of the first preferred embodiment of the present invention. As illustrated in FIG. 6, band-shaped conductor patterns BP12A to BP14A, BP22A, BP32A to BP34A and BP42A disposed on side surfaces SF1 to SF4 extend from the side surfaces of a dielectric layer lyr1 as the lowermost layer to the side surfaces of a dielectric layer Lyr14 as the uppermost layer. An upper surface shield electrode USE1 is connected to each of the band-shaped conductor patterns BP12A, BP13A, BP22A, BP32A and BP33A.

In the low pass filter 1A, the upper surface shield electrode USE1 is directly connected to the side surface shield electrode that is grounded. Therefore, unlike the low pass filter illustrated in FIG. 3, conductor patterns (the via conductor pattern V131 and the line conductor pattern 131 in the low pass filter 1) to connect the upper surface shield electrode USE1 and the shield electrode disposed on the side surface, and a dielectric layer (the dielectric layer Lyr13 in the low pass filter 1) including the above-described conductor patterns provided thereon are not required.

In the case in which the shield electrode is able to be extend from the lowermost layer to the uppermost layer in the manufacturing process, in consideration of the shape and the arrangement of the shield electrode disposed on the side surface, the first preferred embodiment or the Modification 1 of the first preferred embodiment is able to be appropriately selected as a configuration suitable for grounding the upper surface shield electrode.

Modification 2 of First Preferred Embodiment

Figure 7:
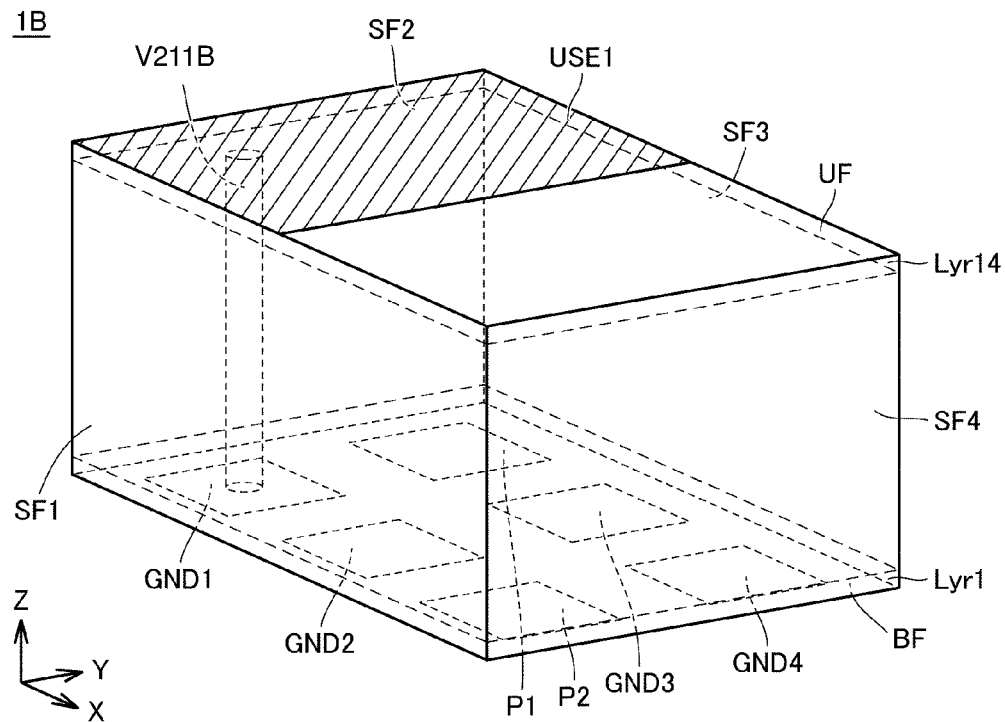
FIG. 7 is an external appearance perspective view of a low pass filter as an example of an electronic component according to a Modification 2 of the first preferred embodiment of the present invention.

In the first preferred embodiment and the Modification of the first preferred embodiment, the upper surface shield electrode is grounded via the shield electrode disposed on the side surface. In a case in which no shield electrodes are disposed on the side surface, an upper surface shield electrode USE1 and a ground electrode GND1 may be directly connected to each other by a via conductor pattern V211B as in a low pass filter 1B illustrated in FIG. 7. In this case, similar to the Modification 1 of the first preferred embodiment, conductor patterns to connect the upper surface shield electrode USE1 and a shield electrode disposed on the side surface, and a dielectric layer including the above-described conductor patterns provided thereon are not required.

Modification 3 of First Preferred Embodiment

Figure 8:
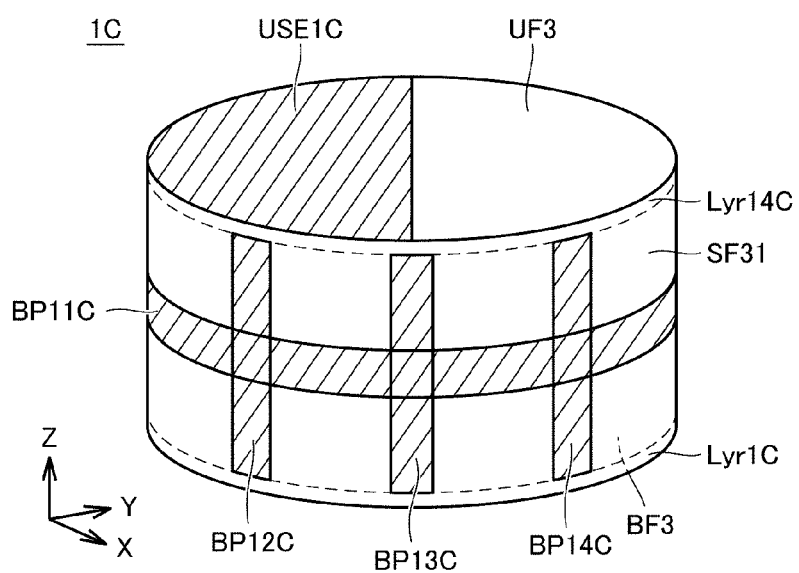
FIG. 8 is an external appearance perspective view of a low pass filter as an example of an electronic component according to a Modification 3 of the first preferred embodiment of the present invention.

In each of the first preferred embodiment and the Modifications 1 and 2 of the first preferred embodiment, the low pass filter having a rectangular or substantially rectangular parallelepiped shape is described. The shape of the electronic component according to the present invention is not limited to a rectangular or substantially rectangular parallelepiped shape, and may preferably have a cylindrical shape as in a low pass filter 1C illustrated in FIG. 8, for example.

An upper surface shield electrode USE1C is disposed on an upper surface UF3 of the low pass filter 1C. Band-shaped conductor patterns BP11C to BP14C are disposed on a side surface SF31. A shield electrode disposed on the side surface SF31 is not provided on a side surface of a dielectric layer Lyr1C (lowermost layer) and on a side surface of a dielectric layer Lyr14C (uppermost layer).

The band-shaped conductor pattern BP11C encircles the side surface once. The band-shaped conductor patterns BP12C to BP14C are spaced apart from each other along the side surface. Each of the band-shaped conductor patterns BP12C to BP14C extends in the Z-axis direction and is orthogonal or substantially orthogonal to the band-shaped conductor pattern BP11C.

The shape of the electronic components according to preferred embodiments of the present invention may be appropriately selected in accordance with the structure or the application of the electronic component.

Modifications 4 and 5 of First Preferred Embodiment

In the first preferred embodiment and the Modifications 1 to 3 of the first preferred embodiment, in a plan view from the normal direction of the upper surface UF, the upper surface shield electrode covers the entirety or substantially the entirety of one of the two regions of the upper surface divided by the specific axis. The upper surface shield electrode does not need to cover the entirety or substantially the entirety of one of the two regions of the upper surface divided by the specific axis, and it is sufficient for the upper surface shield electrode not to be line-symmetric with respect to the specific axis.

Figure 9:
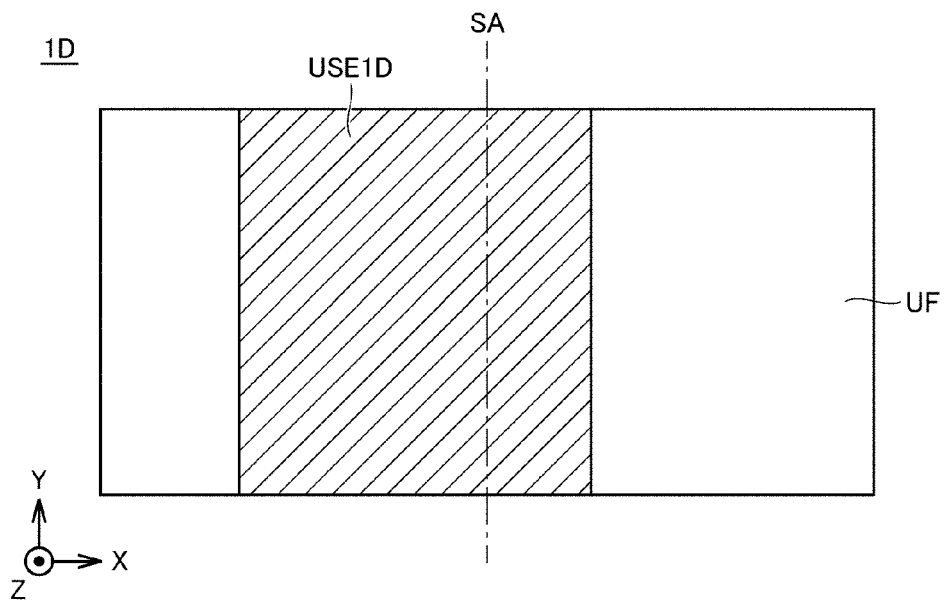
FIG. 9 is a drawing of a low pass filter in a plan view from a normal direction of an upper surface thereof, the low pass filter is an example of an electronic component according to a Modification 4 of the first preferred embodiment of the present invention.

For example, as in a low pass filter 1D illustrated in FIG. 9, an upper surface shield electrode USE1D may be extend across a specific axis SA and may cover a portion of each of the regions divided by the specific axis SA.

Figure 10:
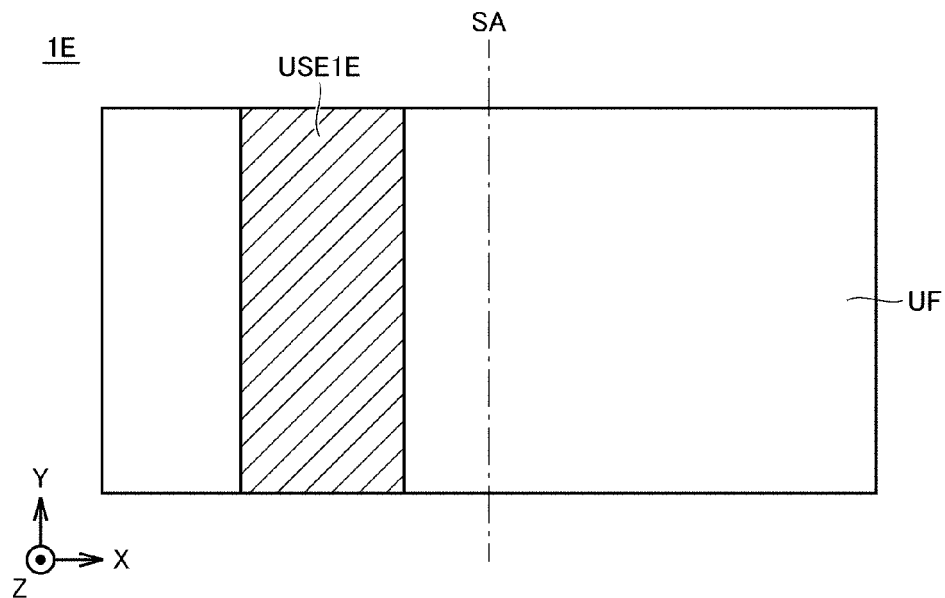
FIG. 10 is a drawing of a low pass filter in a plan view from a normal direction of an upper surface thereof, the low pass filter is an example of an electronic component according to a Modification 5 of the first preferred embodiment of the present invention.

Further, as in a low pass filter 1E illustrated in FIG. 10, an upper surface shield electrode USE1E may cover a portion of one of the two regions divided by the specific axis SA.

In the electronic components according to preferred embodiments of the present invention, the arrangement of the upper surface shield electrode may be appropriately selected, for example, in accordance with the structure of the circuit pattern inside the electronic component or the arrangement of the electronic component on the circuit board.

As described above, also with the electronic components according to the Modifications 1 to 5 of the first preferred embodiment, since the upper surface shield electrode also defines and functions as a direction identification mark, it is possible to reduce the manufacturing cost of the electronic component, which is provided with the shield electrode and the mounting direction of which is able to be identified.

Second Preferred Embodiment

In the first preferred embodiment and the Modifications 1 to 4 of the first preferred embodiment, a case is described in which only the upper surface shield electrode is a shield electrode that overlaps with the circuit pattern inside the electronic component in a plan view from the normal direction of the upper surface. Since the upper surface shield electrode also defines and functions as a direction identification mark, it cannot cover the entire upper surface.

In a second preferred embodiment of the present invention, a case will be described in which a shield electrode overlapping with a circuit pattern inside an electronic component includes, in addition to an upper surface shield electrode, an internal layer shield electrode disposed inside the electronic component in a plan view from a normal direction of the upper surface. According to the second preferred embodiment, the upper surface shield electrode and the internal layer shield electrode cover the entire or substantially the entire upper surface in the plan view from the normal direction of the upper surface.

The second preferred embodiment differs from the first preferred embodiment in that the internal layer shield electrode is provided in addition to the configuration of the first preferred embodiment. Since the remaining configuration is similar to or the same as those of the first preferred embodiment, description thereof will not be repeated.

Figure 11:
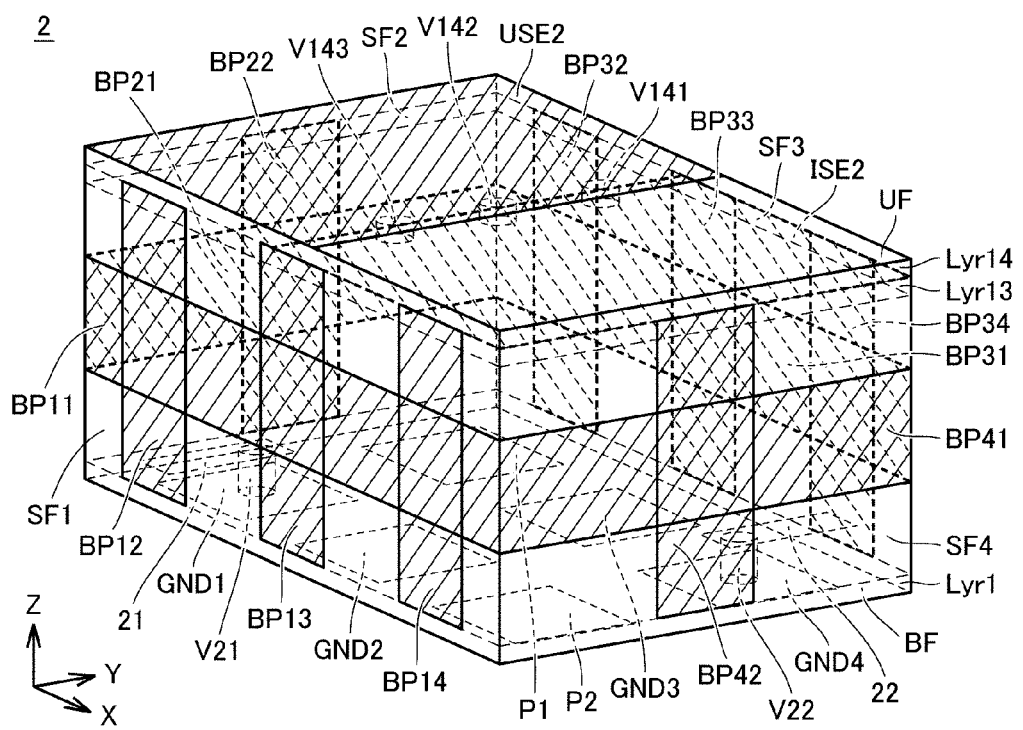
FIG. 11 is an external appearance see-through view of a low pass filter as an example of an electronic component according to a second preferred embodiment of the present invention.

FIG. 11 is an external appearance see-through view of a low pass filter 2 as an example of an electronic component according to the second preferred embodiment. Also in FIG. 11, a circuit pattern provided inside the low pass filter 2 is not illustrated to simplify the description.

As illustrated in FIG. 11, an upper surface shield electrode USE2 is disposed on an upper surface UF. An internal layer shield electrode ISE2 is disposed on a dielectric layer Lyr13. The upper surface shield electrode USE2 and the internal layer shield electrode ISE2 are connected to each other by via conductor patterns V141 to V143. The internal layer shield electrode ISE2 is connected to each of band-shaped conductor patterns BP13, BP14, BP33, BP34 and BP42.

Figure 12:
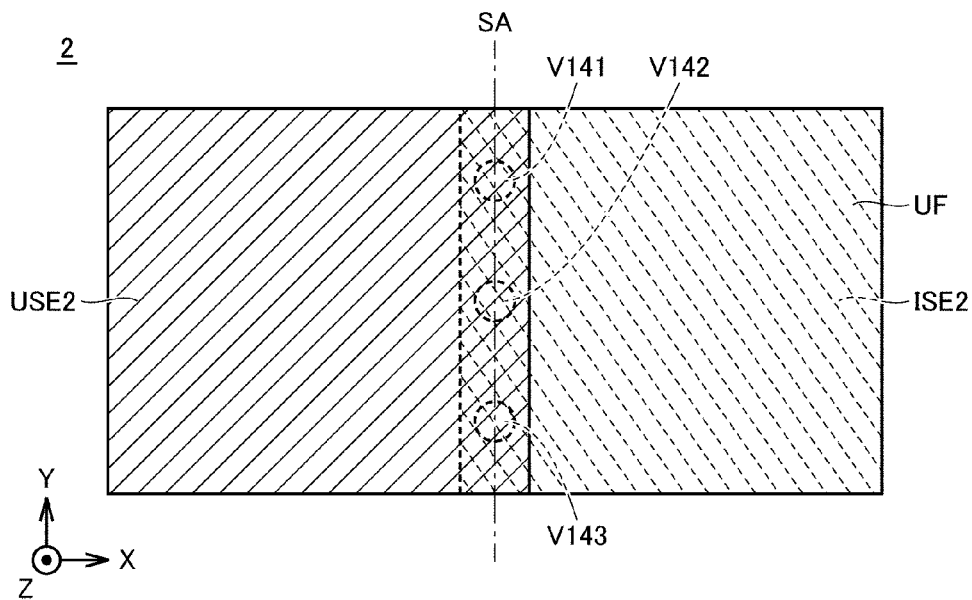
FIG. 12 is a drawing of the low pass filter in FIG. 11 in a plan view from a normal direction of an upper surface thereof.

FIG. 12 is a drawing of the low pass filter 2 in a plan view from a normal direction of the upper surface UF. As illustrated in FIG. 12, the upper surface shield electrode USE2 is not line-symmetric with respect to a specific axis SA. As a result, with the low pass filter 2, the mounting direction is able to be identified.

Further, the upper surface shield electrode USE2 and the internal layer shield electrode ISE2 cover the entire or substantially the entire upper surface UF in the plan view from the normal direction of the upper surface UF. This makes it possible to further improve a shielding effect in the lamination direction in the second preferred embodiment as compared to the first preferred embodiment.

As described above, with the electronic component according to the second preferred embodiment, the upper surface shield electrode disposed on the upper surface of the electronic component is not line-symmetric with respect to the specific axis. When the electronic component is rotated about 180 degrees in a plan view from the normal direction of the circuit board and is disposed on the circuit board, since the appearance of the electronic component in the plan view from the normal direction of the circuit board changes, the mounting direction of the electronic component is able to be identified. Since the upper surface shield electrode also defines and functions as a direction identification mark, a process of additionally providing a direction identification mark on the upper surface of the electronic component is unnecessary. As a result, it is possible to reduce the manufacturing cost of the electronic component, which is provided with the shield electrode and the mounting direction of which is able to be identified.

Further, with the electronic component according to the second preferred embodiment, it is possible to improve the shielding effect in the lamination direction.

Modification 1 of Second Preferred Embodiment

In the second preferred embodiment, the shield electrodes disposed on the side surfaces are not provided on the side surfaces of the lowermost layer and the side surfaces of the uppermost layer. Similar to the Modification 1 of the first preferred embodiment, the shield electrodes disposed on the side surfaces may be provided on the side surfaces of the lowermost layer and the side surfaces of the uppermost layer if it is possible to do so in the manufacturing process.

Figure 13:
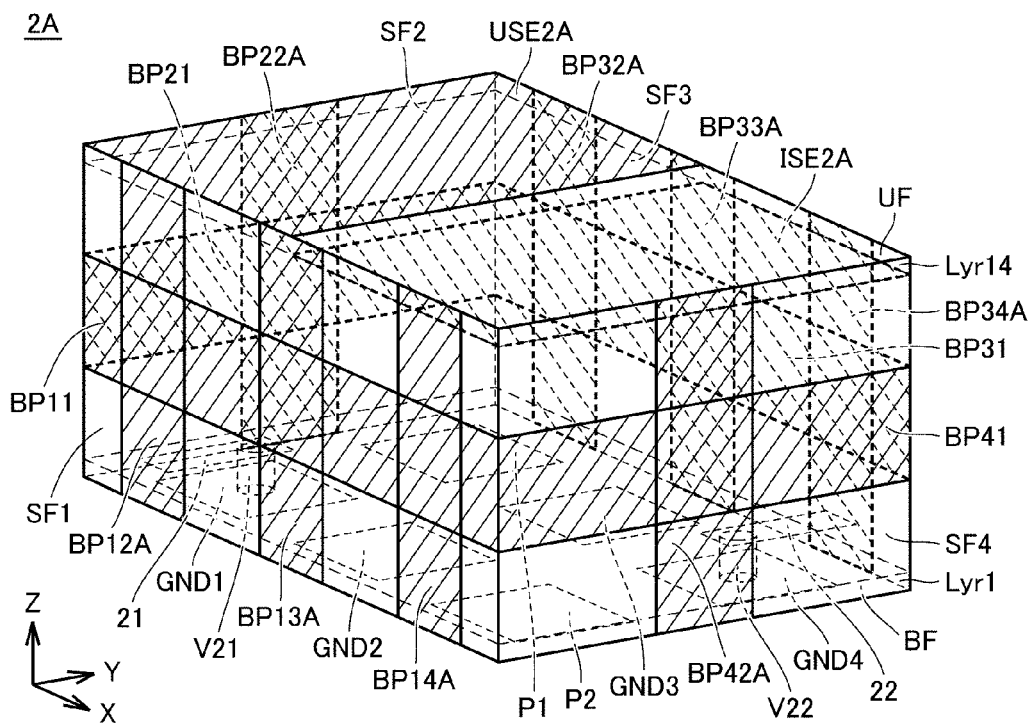
FIG. 13 is an external appearance perspective view of a low pass filter as an example of an electronic component according to a Modification 1 of the second preferred embodiment of the present invention.

FIG. 13 is an external appearance perspective view of a low pass filter 2A as an example of an electronic component according to the Modification 1 of the second preferred embodiment. An upper surface shield electrode USE2A is connected to each of band-shaped conductor patterns BP12A, BP13A, BP22A, BP32A and BP33A. An internal layer shield electrode ISE2A is connected to each of the band-shaped conductor patterns BP13A, BP14A, BP33A, BP34A and BP42A.

In the low pass filter 2A, the upper surface shield electrode USE2A is directly connected to the shield electrode disposed on the side surface. Therefore, unlike the low pass filter 2 illustrated in FIG. 11, via conductor patterns (the via conductor patterns V141 to V143 in the low pass filter 2) to connect the upper surface shield electrode USE2A and the internal layer shield electrode ISE2A are not required.

Figure 14:
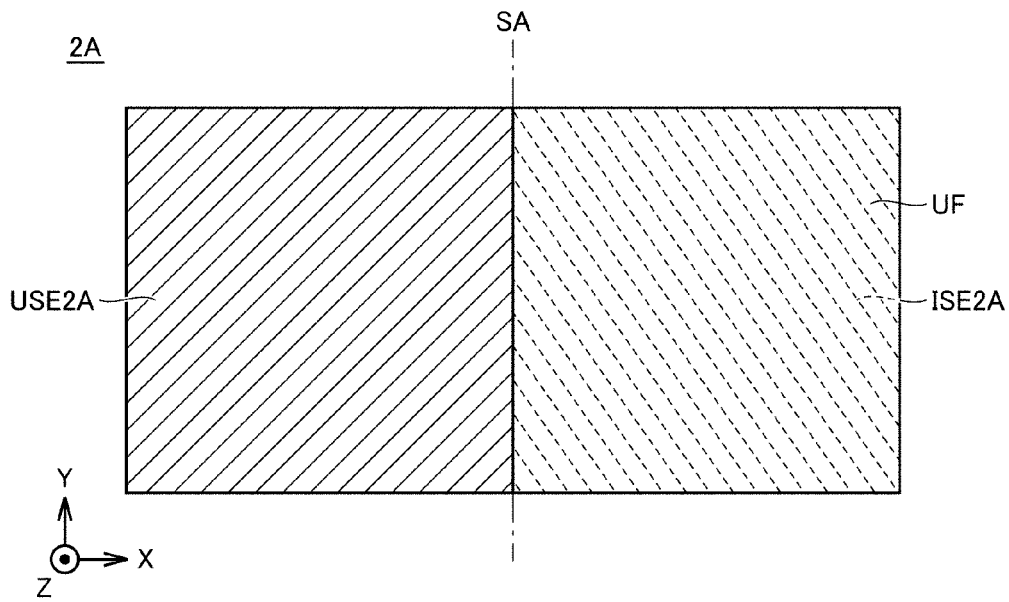
FIG. 14 is a drawing of the low pass filter in FIG. 13 in a plan view from a normal direction of an upper surface thereof.

Further, in the second preferred embodiment, in order for the upper surface shield electrode USE2 to be grounded, the upper surface shield electrode USE2 and the internal layer shield electrode ISE2 need to be connected to each other by the via conductor patterns V141 to V143. Therefore, as illustrated in FIG. 12, it is necessary that the upper surface shield electrode USE2 and the internal layer shield electrode ISE2 overlap each other in the plan view from the normal direction of the upper surface UF. However, in Modification 1 of the second preferred embodiment, since the upper surface shield electrode USE2A is directly connected to the side surface shield electrode that are grounded, it is unnecessary to provide a via conductor pattern to connect the upper surface shield electrode USE2A and the internal layer shield electrode ISE2A. Accordingly, as illustrated in FIG. 14, it is unnecessary for the upper surface shield electrode USE2A and the internal layer shield electrode ISE2A to overlap each other.

In the case in which the shield electrode is able to extend from the lowermost layer to the uppermost layer in the manufacturing process, in consideration of the shape and the arrangement of the shield electrode disposed on the side surface, the second preferred embodiment or the Modification 1 of the second preferred embodiment may be appropriately selected as a configuration suitable for grounding the upper surface shield electrode.

Modifications 2 to 4 of Second Preferred Embodiment

In the second preferred embodiment and the Modification 1 of the second preferred embodiment, the upper surface shield electrode is grounded via the shield electrode disposed on the side surface. It is sufficient that the upper surface shield electrode is grounded, and therefore it is unnecessary for any shield electrode to be interposed to ground the upper surface shield electrode.

Figure 15:
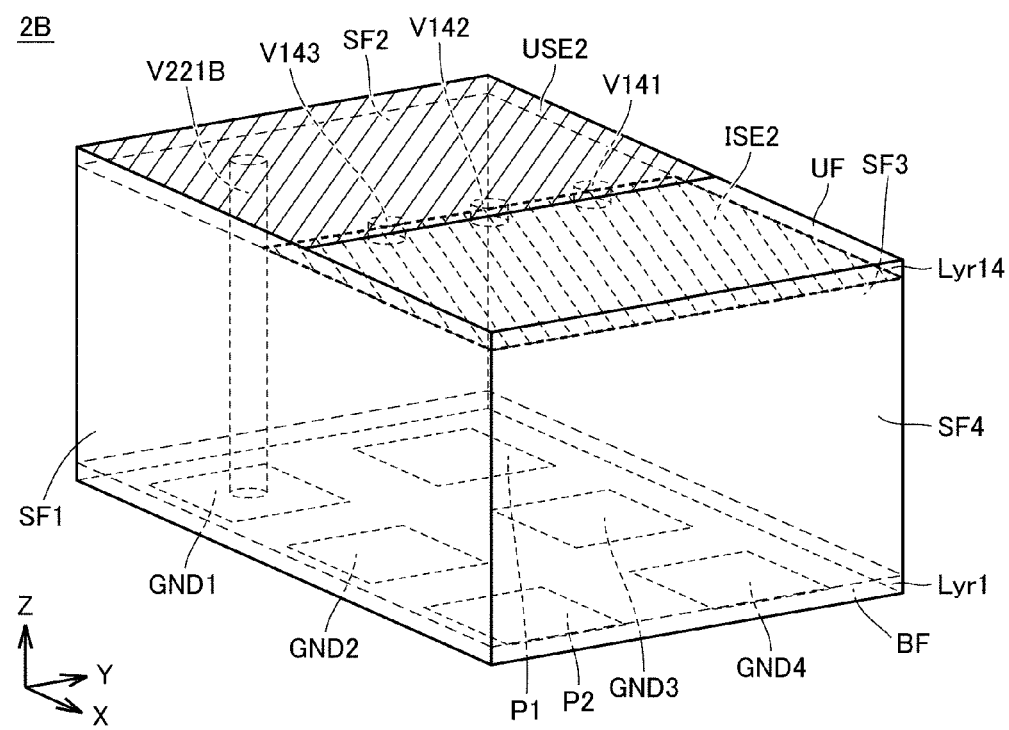
FIG. 15 is an external appearance perspective view of a low pass filter as an example of an electronic component according to a Modification 2 of the second preferred embodiment of the present invention.
Figure 16:
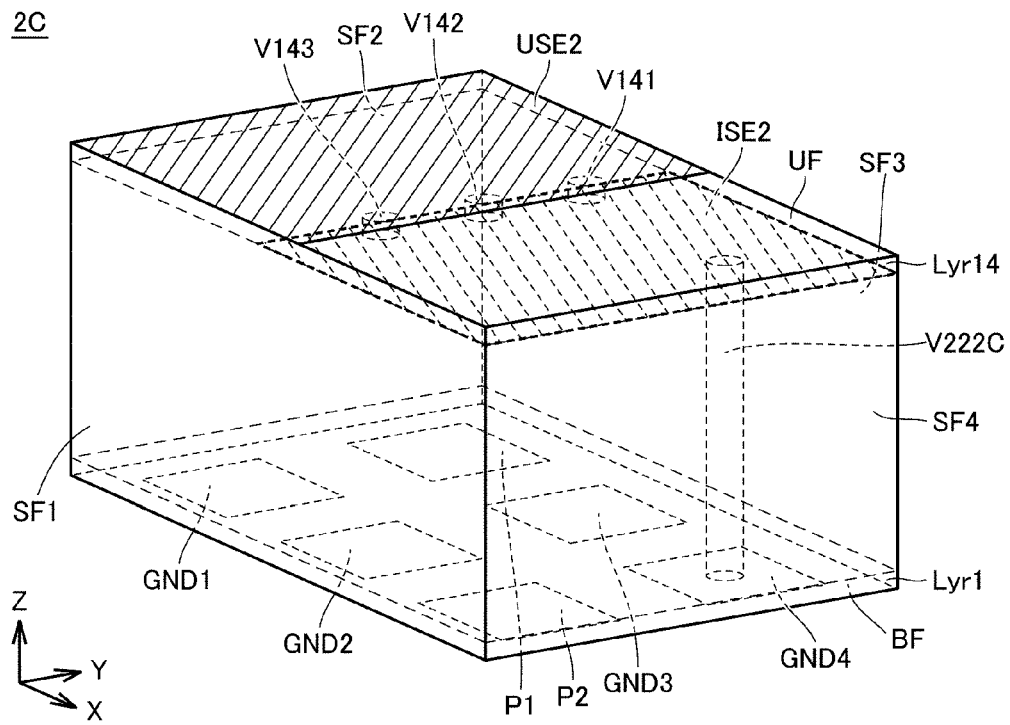
FIG. 16 is an external appearance perspective view of a low pass filter as an example of an electronic component according to a Modification 3 of the second preferred embodiment of the present invention.

In the case in which an upper surface shield electrode and an internal layer shield electrode are connected by a via conductor pattern, an upper surface shield electrode USE2 and a ground electrode GND1 may be connected by a via conductor pattern V221B as in a low pass filter 2B illustrated in FIG. 15. Alternatively, as in a low pass filter 2C illustrated in FIG. 16, an internal layer shield electrode ISE2 and a ground electrode GND4 may be connected by a via conductor pattern V222C.

Figure 17:
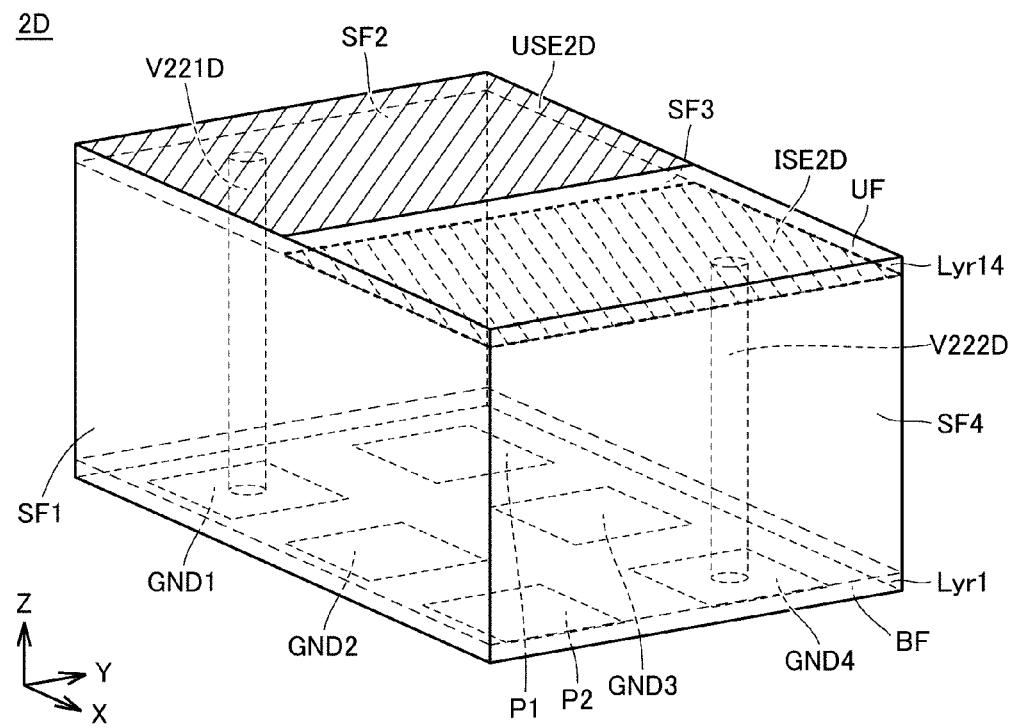
FIG. 17 is an external appearance perspective view of a low pass filter as an example of an electronic component according to a Modification 4 of the second preferred embodiment of the present invention.

In the case in which an upper surface shield electrode and an internal layer shield electrode are connected by a via conductor pattern, an upper surface shield electrode USE2D and a ground electrode GND1 may be connected by a via conductor pattern V221D and an internal layer shield electrode ISE2D and a ground electrode GND4 may be connected by a via conductor pattern V222D, as in a low pass filter 2D illustrated in FIG. 17.

Modifications 5 and 6 of Second Preferred Embodiment

In electronic components according to preferred embodiments of the present invention, parasitic capacitance may be generated between each of an upper surface shield electrode and internal layer shield electrode and each of dielectric layers forming the electronic component. Since the parasitic capacitance may affect the characteristics of the electronic component, it is necessary to adjust the parasitic capacitance.

Figure 18:
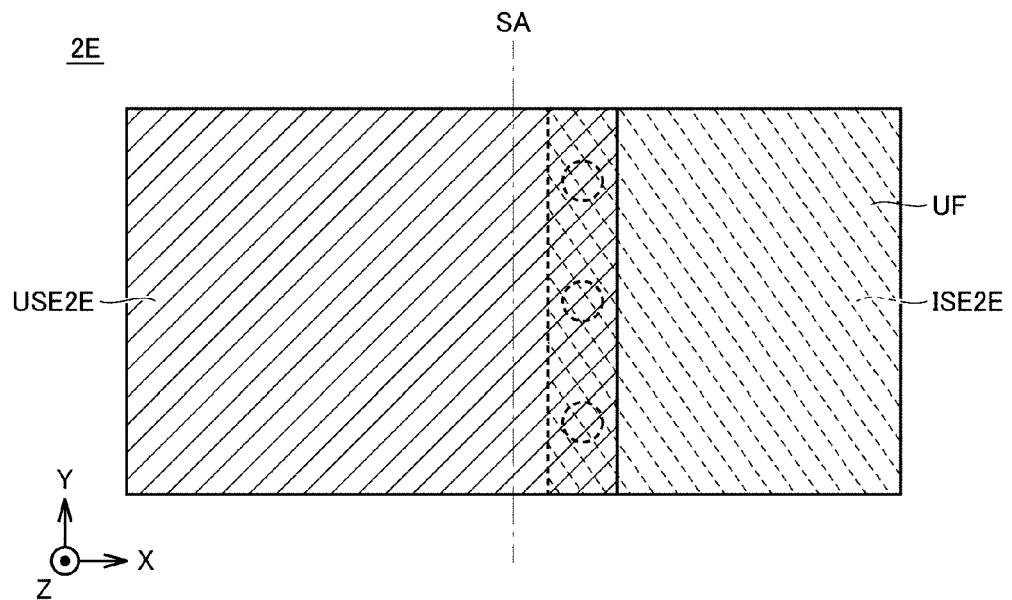
FIG. 18 is a drawing of a low pass filter in a plan view from a normal direction of an upper surface thereof, the low pass filter is an example of an electronic component according to a Modification 5 of the second preferred embodiment of the present invention.

For example, when it is preferable to reduce the parasitic capacitance generated between each of an upper surface shield electrode and internal layer shield electrode and each of dielectric layers, as in a low pass filter 2E illustrated in FIG. 18, an area of an upper surface shield electrode USE2E, which is disposed farther from each of the dielectric layers defining the low pass filter 2E, is larger than an area of an internal layer shield electrode ISE2E. With this configuration, it is possible to reduce the parasitic capacitance generated between the internal layer shield electrode ISE2E, which is disposed closer to each of the dielectric layers, and each of the dielectric layers. This makes it possible to reduce the parasitic capacitance generated between each of the upper surface shield electrode USE2E and the internal layer shield electrode ISE2E and each of the dielectric layers.

Figure 19:
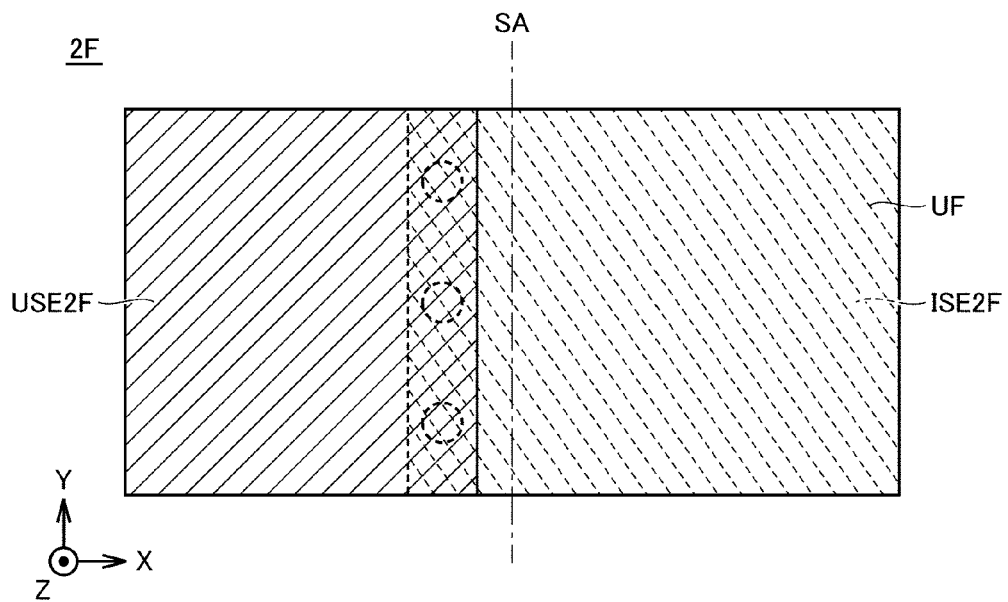
FIG. 19 is a drawing of a low pass filter in a plan view from a normal direction of an upper surface thereof, the low pass filter is an example of an electronic component according to a Modification 6 of the second preferred embodiment of the present invention.

On the other hand, there is a case in which, when parasitic capacitance generated between each of an upper surface shield electrode and an internal layer shield electrode and each of dielectric layers is preferable to be used as a ground capacitor (shunt capacitor) or other suitable structure, the parasitic capacitance is required to be larger. In such a case, as in a low pass filter 2F illustrated in FIG. 19, an area of an upper surface shield electrode USE2F is smaller than an area of an internal layer shield electrode ISE2F. With this configuration, it is possible to increase the parasitic capacitance generated between the internal layer shield electrode ISE2F, which is disposed closer to each of the dielectric layers, and each of the dielectric layers. This makes it possible to increase the parasitic capacitance generated between each of the upper surface shield electrode USE2F and the internal layer shield electrode ISE2F and each of the dielectric layers.

Modification 7 of Second Preferred Embodiment

Figure 20:
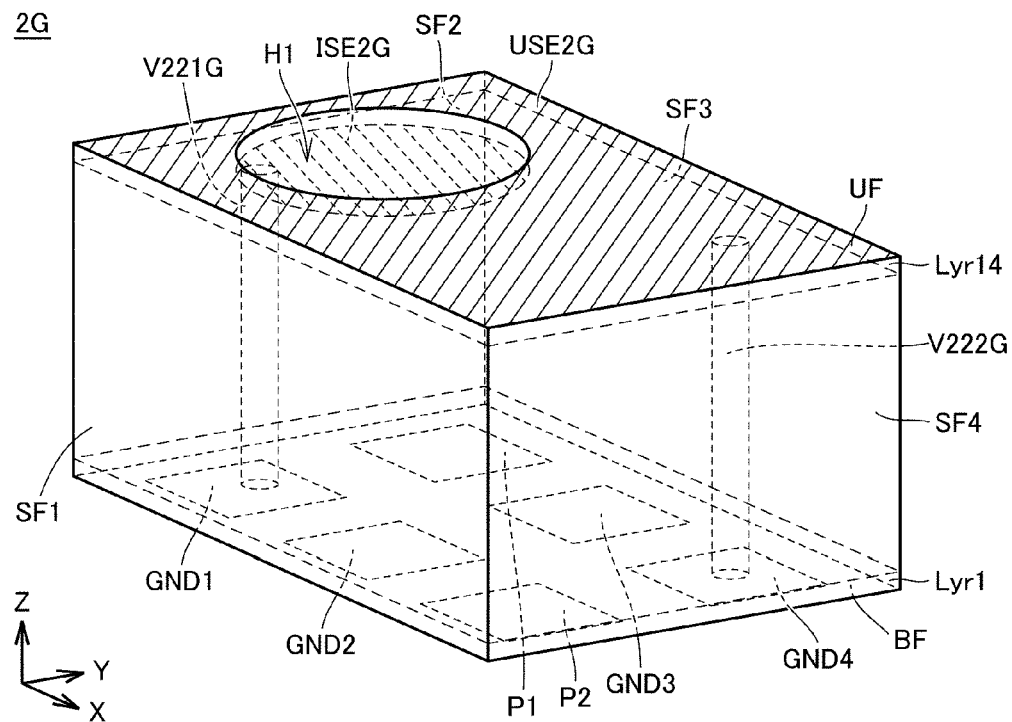
FIG. 20 is an external appearance perspective view of a low pass filter as an example of an electronic component according to a Modification 7 of the second preferred embodiment of the present invention.

In a Modification 7 of the second preferred embodiment, a case will be described in which a hole is provided in an upper surface shield electrode passing therethrough in a normal direction of the upper surface. FIG. 20 is an external appearance perspective view of a low pass filter 2G as an example of an electronic component according to the Modification 7 of the second preferred embodiment. The configuration of the low pass filter 2G illustrated in FIG. 20 is such that the upper surface shield electrode USE2D, the internal layer shield electrode ISE2D, and the via conductor patterns V221D and V222D of the low pass filter 2D illustrated in FIG. 17 are replaced with an upper surface shield electrodes USE2G, an internal layer shield electrode ISE2G and via conductor patterns V221G and V222G, respectively. Since the remaining configuration is similar to or the same as those of the low pass filter 2D, description thereof will not be repeated.

A hole H1 is provided in the upper surface shield electrode USE2G passing therethrough in a normal direction of an upper surface UF. The upper surface shield electrode USE2G is connected to a ground electrode GND4 by the via conductor pattern V222G. The internal layer shield electrode ISE2G is connected to a ground electrode GND1 by the via conductor pattern V221G. The hole H1 and the internal layer shield electrode ISE2G have substantially the same shape.

Figure 21:
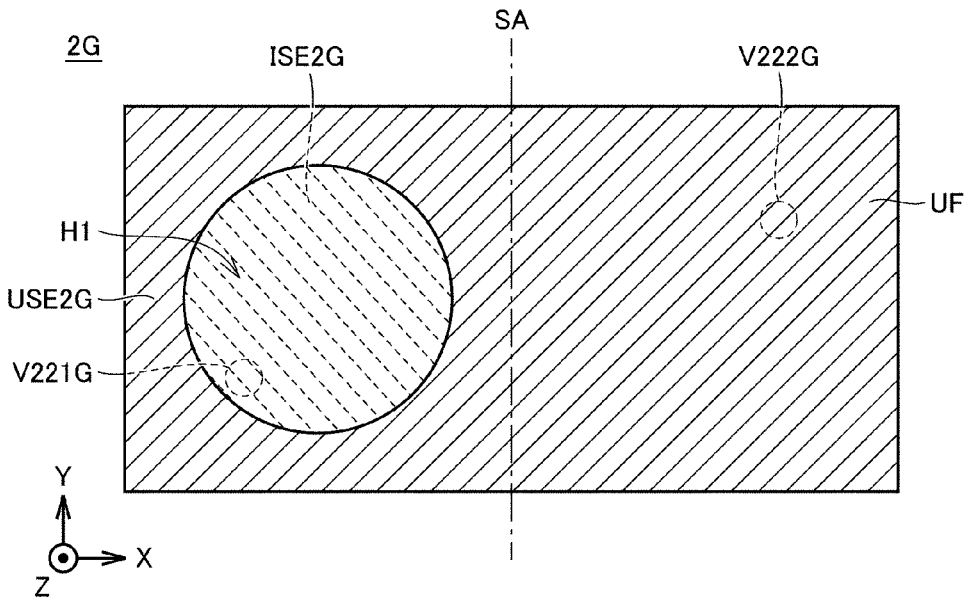
FIG. 21 is a drawing of the low pass filter in FIG. 20 in a plan view from a normal direction of an upper surface thereof.

FIG. 21 is a drawing of the low pass filter 2G in FIG. 20 in a plan view from the normal direction of the upper surface UF. As illustrated in FIG. 21, the upper surface shield electrode USE2G and the internal layer shield electrode ISE2G cover the entire or substantially the entire upper surface UF in a plan view from the normal direction of the upper surface UF.

As described above, also with the electronic components according to the Modifications 1 to 7 of the second preferred embodiment, since the upper surface shield electrode also defines and functions as a direction identification mark, it is possible to reduce the manufacturing cost of the electronic component, which is provided with the shield electrode and the mounting direction of which is able to be identified.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an upper surface;
   a lower surface;
   a side surface;
   a circuit pattern provided inside the electronic component;
   an internal layer shield electrode provided between the circuit pattern and the upper surface; and
   an upper surface shield electrode disposed on the upper surface; wherein
   a center of gravity of the upper surface shield electrode is spaced from a center of gravity of the upper surface in a plan view from a normal direction of the upper surface;
   the internal layer shield electrode is grounded;
   the internal layer shield electrode includes a region not covered with the upper surface shield electrode in the plan view from the normal direction;
   the electronic component is a low pass filter;
   the low pass filter includes a first input-output terminal, a second input-output terminal, an LC parallel resonator, and an LC series resonator;
   the LC series resonator includes an inductor, a first capacitor, and a second capacitor;
   one end of the inductor is connected to a ground point;
   the first capacitor is connected between the first input-output terminal and another end of the inductor; and
   the second capacitor is connected between the second input-output terminal and the another end of the inductor.

2. The electronic component according to claim 1, further comprising:
   a side surface shield electrode disposed on the side surface; wherein
   the upper surface shield electrode is grounded via the side surface shield electrode.

3. The electronic component according to claim 2, wherein the upper surface shield electrode is connected to the side surface shield electrode.

4. The electronic component according to claim 2, further comprising:
   a line conductor pattern connected to the side surface shield electrode; and
   a via conductor pattern connected to the upper surface shield electrode and the line conductor pattern.

5. The electronic component according to claim 1, further comprising:
   a ground electrode disposed on the lower surface; and
   a via conductor pattern connected to the upper surface shield electrode and the ground electrode.

6. The electronic component according to claim 1, wherein the circuit pattern is covered with the upper surface shield electrode and the internal layer shield electrode in the plan view from the normal direction.

7. The electronic component according to claim 1, further comprising:
   a side surface shield electrode disposed on the side surface; wherein
   each of the upper surface shield electrode and the internal layer shield electrode is grounded via the side surface shield electrode.

8. The electronic component according to claim 7, wherein each of the upper surface shield electrode and the internal layer shield electrode is connected to the side surface shield electrode.

9. The electronic component according to claim 7, further comprising:
   a via conductor pattern connected to the upper surface shield electrode and the internal layer shield electrode; wherein
   the internal layer shield electrode is connected to the side surface shield electrode.

10. The electronic component according to claim 1, further comprising:
    a ground electrode disposed on the lower surface;
    a first via conductor pattern connected to the upper surface shield electrode and to the internal layer shield electrode; and
    a second via conductor pattern connected to at least one of the upper surface shield electrode and the internal layer shield electrode and to the ground electrode.

11. The electronic component according to claim 1, further comprising:
    a first ground electrode and a second ground electrode disposed on the lower surface;
    a first via conductor pattern connected to the upper surface shield electrode and to the first ground electrode; and
    a second via conductor pattern connected to the internal layer shield electrode and to the second ground electrode.

12. The electronic component according to claim 1, wherein an area of the upper surface shield electrode is larger than an area of the internal layer shield electrode in the plan view from the normal direction.

13. The electronic component according to claim 1, wherein an area of the upper surface shield electrode is smaller than an area of the internal layer shield electrode in the plan view from the normal direction.

14. The electronic component according to claim 1, wherein a hole is provided in the upper surface shield electrode passing through the upper surface shield electrode in the normal direction.

15. The electronic component according to claim 1, wherein the low pass filter includes a multilayer body including a plurality of dielectric layers laminated in a lamination direction.

16. The electronic component according to claim 15, wherein the internal layer shield electrode is disposed on one of the plurality of dielectric layers;

the upper surface shield electrode and the internal layer shield electrode are connected to each other by via conductor patterns; and the internal layer shield electrode is connected to each of band-shaped conductor patterns disposed on the side surface.

17. An electronic component comprising:

an upper surface;

a lower surface;

a side surface;

a circuit pattern provided inside the electronic component;

an internal layer shield electrode provided between the circuit pattern and the upper surface; and an upper surface shield electrode disposed on the upper surface; wherein the upper surface shield electrode is not line-symmetric with respect to a specific axis that bisects the upper surface when the electronic component is rotated about 180 degrees in a plan view from a normal direction of the upper surface;

the internal layer shield electrode is grounded;

the internal layer shield electrode includes a region not covered with the upper surface shield electrode in the plan view from the normal direction;

the electronic component is a low pass filter;

the low pass filter includes a first input-output terminal, a second input-output terminal, an LC parallel resonator, and an LC series resonator;

the LC series resonator includes an inductor, a first capacitor, and a second capacitor;

one end of the inductor is connected to a ground point;

the first capacitor is connected between the first input-output terminal and another end of the inductor; and the second capacitor is connected between the second input-output terminal and the another end of the inductor.

18. The electronic component according to claim 17, wherein the low pass filter includes a multilayer body including a plurality of dielectric layers laminated in a lamination direction.

19. The electronic component according to claim 18, wherein the internal layer shield electrode is disposed on one of the plurality of dielectric layers;

the upper surface shield electrode and the internal layer shield electrode are connected to each other by via conductor patterns; and the internal layer shield electrode is connected to each of band-shaped conductor patterns disposed on the side surface.

* * * * *